US011343929B2

United States Patent
Ju et al.

(10) Patent No.: US 11,343,929 B2
(45) Date of Patent: May 24, 2022

(54) METHOD FOR CONTROLLING POWER USING SOCKET AND ELECTRONIC DEVICE SUPPORTING THE SAME

(71) Applicant: Samsung Electronics Co., Ltd., Gyeonggi-do (KR)

(72) Inventors: Wanjae Ju, Gyeonggi-do (KR); Seunghak Lee, Gyeonggi-do (KR); Sungchel Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 124 days.

(21) Appl. No.: 17/009,901

(22) Filed: Sep. 2, 2020

(65) Prior Publication Data
US 2021/0068284 A1    Mar. 4, 2021

(30) Foreign Application Priority Data

Sep. 3, 2019   (KR) .................. 10-2019-0109010

(51) Int. Cl.
| *H04M 1/00* | (2006.01) |
| *H04M 9/00* | (2006.01) |
| *H05K 5/02* | (2006.01) |
| *G06F 1/16* | (2006.01) |
| *H04M 1/02* | (2006.01) |
| *H04M 19/08* | (2006.01) |

(52) U.S. Cl.
CPC ......... *H05K 5/0286* (2013.01); *G06F 1/1658* (2013.01); *H04M 1/0249* (2013.01); *H04M 19/08* (2013.01)

(58) Field of Classification Search
CPC .. H05K 5/0286; G06F 1/1658; H04M 1/0249; H04M 19/08
See application file for complete search history.

(56) References Cited

U.S. PATENT DOCUMENTS

| 4,632,398 A | 12/1986 | Freeman et al. |
| 5,297,261 A | 3/1994 | Kuranaga |
| 9,622,364 B2 | 4/2017 | Baek et al. |
| 9,647,359 B2 | 5/2017 | Cho et al. |

(Continued)

FOREIGN PATENT DOCUMENTS

| JP | 05-083825 U | 11/1993 |
| JP | 2533192 B2 | 9/1996 |

(Continued)

OTHER PUBLICATIONS

International Search Report dated Dec. 23, 2020.

*Primary Examiner* — Simon King
(74) *Attorney, Agent, or Firm* — Cha & Reiter, LLC

(57) ABSTRACT

An electronic device is provided. The electronic device includes a housing including an opening defined on at least one surface of the housing, a socket adjacent to the opening in the housing, a tray insertable into the socket through the opening and configured to hold one or more cards, a battery, a power management circuit configured to control power provided from the battery, and a first terminal connected to the power management circuit, the first terminal included in the socket, wherein the power management module is configured to control a provision of power from the battery to at least one internal component of the electronic device based on a first signal detected via the first terminal.

20 Claims, 9 Drawing Sheets

(56) References Cited

U.S. PATENT DOCUMENTS

| | | |
|---|---|---|
| 9,837,765 B2 | 12/2017 | Heiskanen |
| 10,331,199 B2 | 6/2019 | Lee |
| 10,340,634 B2 | 7/2019 | Heiskanen |
| 2007/0218946 A1 | 9/2007 | Kim |
| 2014/0101466 A1* | 4/2014 | Itakura ............... G06F 1/32 713/300 |
| 2015/0245515 A1 | 8/2015 | Baek et al. |
| 2016/0142891 A1* | 5/2016 | Virhiä ............... G06Q 50/01 340/870.07 |
| 2016/0164204 A1 | 6/2016 | Cho et al. |
| 2016/0380385 A1 | 12/2016 | Heiskanen |
| 2017/0214423 A1* | 7/2017 | Park ............... H04B 1/3818 |
| 2017/0242474 A1 | 8/2017 | Lee |
| 2018/0034208 A1 | 2/2018 | Heiskanen |
| 2018/0299924 A1* | 10/2018 | Seo ............... G06F 1/1635 |
| 2021/0136942 A1 | 5/2021 | Lee et al. |

FOREIGN PATENT DOCUMENTS

| | | |
|---|---|---|
| KR | 10-0724864 B1 | 6/2007 |
| KR | 10-2018-0100908 A | 9/2018 |

\* cited by examiner

METHOD FOR CONTROLLING POWER USING SOCKET AND ELECTRONIC DEVICE SUPPORTING THE SAME

CROSS-REFERENCE TO RELATED APPLICATION(S)

This application claims the benefit under 35 U.S.C. § 119(a) of a Korean patent application filed on Sep. 3, 2019 in the Korean Intellectual Property Office and assigned Serial number 10-2019-0109010, the entire disclosure of which is hereby incorporated by reference.

TECHNICAL FIELD

The present disclosure relates to an electronic device having a tray for insertion of various types of cards, and more particular, to controlling operation of the device and the supply of power to the device according to operation of the tray.

BACKGROUND

Electronic devices such as smartphones, tablet PCs, and on the like may operate using power provided by a battery. A power management module (e.g., a power management integrated circuit or "PMIC") may transmit power provided from the battery to various components of the electronic device (e.g., such as a processor, a memory, or a communication chip).

When a situation such as an operation error occurs while the electronic device is utilized, a user may be required to force a power off operation, and/or execute a hard reset of the electronic device. Executing a forced power-off operation may include pressing of a physical button such as a power button, a volume button, or the. For example, in one example forced power-off operation, when the power button and the volume button are simultaneously pressed for seven seconds or more, the electronic device may be powered off and/or reset.

SUMMARY

The electronic device according to the related art may include physical buttons such as a power button or a volume button. If a state in which it is not possible to control the electronic device due to an operation error occurs in the process of using the electronic device, the user may force the electronic device to be powered off or reset by pressing physical buttons in a preset combination.

In recent years, keyless electronic device have been introduced that do not include any physical buttons. As a result, a forcible power off or reset operation using physical buttons may not be possible. When the user wants to forcibly reset the electronic device, for the user may have no option but await for a remaining battery charge to be completely drained, or visit a service center for resetting by professional technical staff, which may increase user inconvenience.

An aspect of the present disclosure is to provide an electronic device including a housing including an opening defined on at least one surface of the housing, a socket adjacent to the opening in the housing, a tray insertable into the socket through the opening and configured to hold one or more cards, a battery, a power management circuit configured to control power provided from the battery, and a first terminal connected to the power management circuit, the first terminal included in the socket, wherein the power management module is configured to control a provision of power from the battery to at least one internal component of the electronic device based on a first signal detected via the first terminal Another aspect of the present disclosure is to provide an electronic device, including: a housing including an opening defined on at least one surface of the housing, a socket adjacent to the opening in the housing, a tray insertable into the socket through the opening and configured to hold one or more cards, a battery, a power management circuit electrically connected with the socket and configured to control power provided from the battery, a first terminal connected to the power management circuit, the first terminal included in the socket, a moving unit included in the socket that is movable when force is applied via external pressure, and a tray discharge unit configured to eject the tray from the socket to an external environment of the electronic device via a force transmitted through movement of the moving unit over a first distance, wherein the power management circuit is configured to control a provision of power from the battery to at least one internal component of the electronic device, based on a change in a first signal detected via the first terminal and caused by movement of the moving unit.

The electronic device according to certain embodiments of the present disclosure may electrically connect the socket for inserting the tray and the power management module and cut off or reset power provided to the element inside the electronic device based on the signal transmitted from the socket to the power management module.

The electronic device according to certain embodiments of the present disclosure may cut off or reset the power provided to the element inside the electronic device based on the signal associated with connection or separation of the tray for card holding and the socket.

BRIEF DESCRIPTION OF THE DRAWINGS

With respect to the description of the drawings, the same or similar reference signs may be used for the same or similar elements.

DETAILED DESCRIPTION

Figure 1:
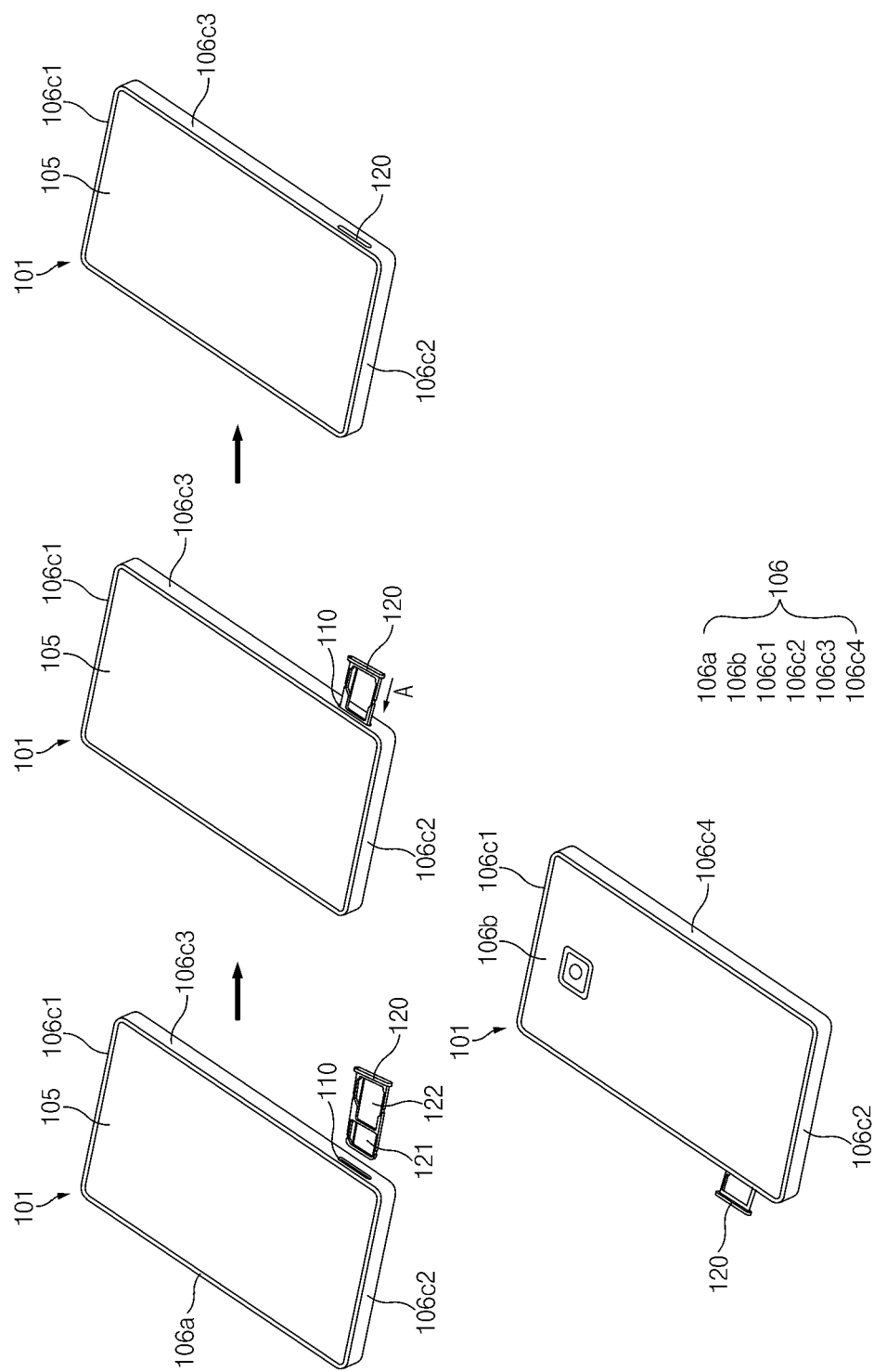
FIG. 1 is a perspective view of an electronic device according to certain embodiments of the present disclosure.

Hereinafter, certain embodiments of the disclosure may be described with reference to accompanying drawings. However, this is not intended to limit the technologies described in the disclosure to specific embodiments, and it should be understood to include various modifications, equivalents, and/or alternatives of the embodiment of the disclosure. With regard to description of drawings, similar components may be marked by similar reference numerals.

FIG. 1 is a perspective view of an electronic device according to certain embodiments of the present disclosure.

Referring to FIG. 1, the electronic device 101 may include a display 105 and a housing 106.

The display 105 may visually display various contents such as text and images. The display 105 may be mounted on a first surface (or front surface) 106a of the housing 106 and may occupy most or all areas of the first surface 106a.

the display 105 may be mounted on the housing 106 (e.g., a "main body portion"). The housing 106 may include the first surface (or front surface) 106a on which the display 105 is mounted on the outer side, a second surface (or back surface) 106b opposite to the first surface, and side surfaces 106c1, 106c2, 106c3, and 106c4 connecting the first surface and the second surface. The housing 106 may include various components (e.g., a processor, a memory, a communication chip, a printed circuit board, and a battery) required for operations of the electronic device 101 therein.

According to certain embodiments of the present disclosure, the housing 106 may be implemented using a keyless design. For example, the housing 106 may be incorporate a smooth surface, due to the omission of mechanical buttons, such as a physical power button, volume button, or home button, as these would normally protrude from the first surface 106a, the second surface 106b, or the side surfaces 106c1, 106c2, 106c3, and 106c4, and disturb the smooth surface of the device.

According to certain embodiments of the present disclosure, the housing 106 may include an opening 110 on the outer portion. For example, the housing 106 may include the opening 110 in one of the side surfaces 106c1, 106c2, 106c3, and 106c4. A tray 120 in which a card is allowed to be disposed may be inserted through the opening 110. In FIG. 1, a case is exemplarily illustrated where the opening 110 is formed on the right side surface 106c3 of the display 105; however, the present disclosure is not limited thereto. The opening 110 may be formed on the upper side surface 106c1, the lower side surface 106c2, the left side surface 106c4, or the second surface (or back surface) 106b. The opening 110 may have a shape corresponding to the tray 120 and may define an entrance for a socket (or card connector) disposed inside the housing 106. For example, at least a portion of the tray 120 may be inserted into the opening 110, and may contact at least a portion of the socket positioned inside the opening 110. The tray 120 may be inserted into the opening 110 with a card (e.g., a subscriber identification module (SIM) card or a universal subscriber identity module (USIM) card) or a memory card (e.g., an SD card, or a Micro SD card) disposed thereon. The electronic device 101 may include a contact region for providing electrical connection with the card in the opening 110.

According to certain embodiments of the present disclosure, the tray 120 may include a first card region 121 and a second card region 122. For example, the tray 120 may include the first card region 121 and the second card region 122, thus holding two SIM cards. For another example, the tray 120 may include the first card region 121 for holding one SIM card and the second card region 122 for holding one memory card. For another example, the tray 120 may include the first card region 121 for holding one SIM card and the second card region 122 of a hybrid type that may correspond to two or more types of cards.

In FIG. 1, a case is example illustrated where the tray 120 includes the first card region 121 and the second card region 122 and the second card region 122 is implemented as a hybrid type card region; however, the present disclosure is not limited thereto. For example, the first card region 121 may be implemented as a hybrid type card region, or both the first card region 121 and the second card region 122 may be implemented as hybrid type card regions.

For another example, for recent devices using an embedded SIM (eSIM), which do not require a SIM card, the tray 120 may be a single tray for the micro SD, or conversely, may be designed as a tray specifically designed for the SIM card depending on the characteristics of the device.

In FIG. 1, a case is example illustrated where the two card holding regions are disposed in the direction in which the tray 120 is inserted into the opening 110 (A direction); however, the present disclosure is not limited thereto. For example, the two card regions may be disposed in a direction perpendicular to the direction in which the tray 120 is inserted into the opening 110, or a card insertion region may be provided in a horizontal direction.

According to certain embodiments of the present disclosure, the electronic device 101 may detect the insertion or discharge of the tray 120 to generate a signal to cut off or reset the power to elements or components inside the electronic device 101. For example, a power management module (e.g., a power management integrated circuit or "PMIC") inside the electronic device 101 may determine whether to transmit power provided by the battery to the elements or components (e.g., processor, memory, communication chip or display) inside the electronic device 101 based on the signal that is changed with the insertion or discharge of the tray 120. Additional information regarding power control depending on the insertion or discharge of the tray 120 may be provided through FIGS. 2 to 9.

Figure 2:
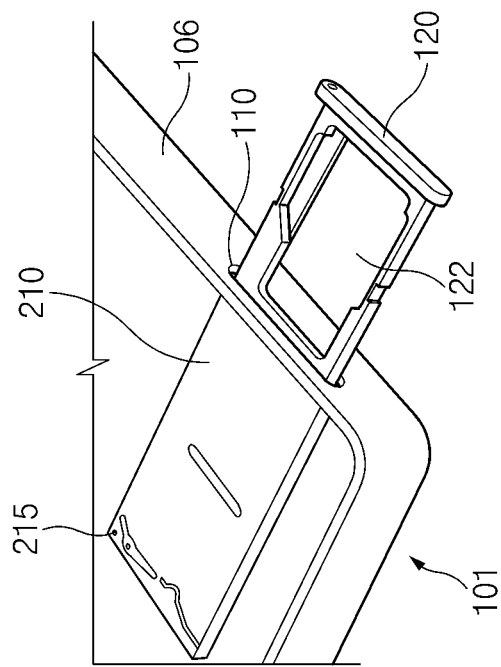
FIG. 2 is a configuration diagram illustrating coupling of a tray and a socket according to certain embodiments of the present disclosure.
Figure 2:
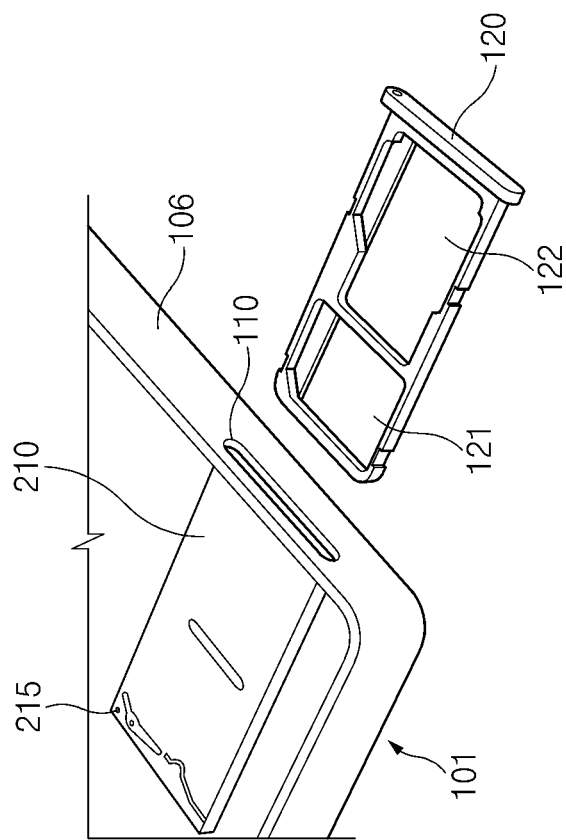

FIG. 2 is a configuration diagram illustrating coupling of the tray and the socket according to certain embodiments of the present disclosure.

Referring to FIG. 2, the electronic device 101 may include a socket 210 inside the housing 106. The socket 210 may be mounted on a circuit board (e.g., a printed circuit board (PCB)) included in the electronic device 101. The tray 120 may be inserted through the opening 110 and may be coupled with the socket 210.

The socket 210 may be implemented having a physical configuration corresponding to the tray 120 to facilitate insertion of the same. The socket 210 may include a contact region for electrical connection with a terminal of each card when the tray 120 in which the card is held is inserted into the socket. For example, if the tray 120 includes the first card region 121 and the second card region 122, the socket 210 may include a first contact region for corresponding to the first card region 121 and a second contact region for corresponding to the second card region 122. If the second card region is a hybrid type, the socket 210 may include various types of contact regions corresponding to a plurality of cards.

According to certain embodiments of the present disclosure, the socket 210 may further include a tray discharge unit (e.g., a first rotating unit 740 (or tray discharge unit) of FIG. 7) for discharging the inserted tray 120.

According to certain embodiments of the present disclosure, the socket 210 may include a first terminal (or tray detection terminal, power management terminal) 215 electrically connected to the power management module (e.g., a power management integrated circuit (PMIC)) (an electronic power management module 310 of FIG. 3) inside the electronic device 101. The power management module (e.g., PMIC) inside the electronic device 101 may generate a signal for termination a supply of power provided to elements or components inside the electronic device 101 or resetting the elements or components, based on a change in a signal transmitted via the first terminal 215.

According to an embodiment, the signal of the first terminal 215 may be changed according to the coupling or separation—of the tray 120 and the socket 210. According to another embodiment, the signal of the first terminal 215 may be changed by additional external pressure generated after the discharge of the tray 120.

Figure 3:
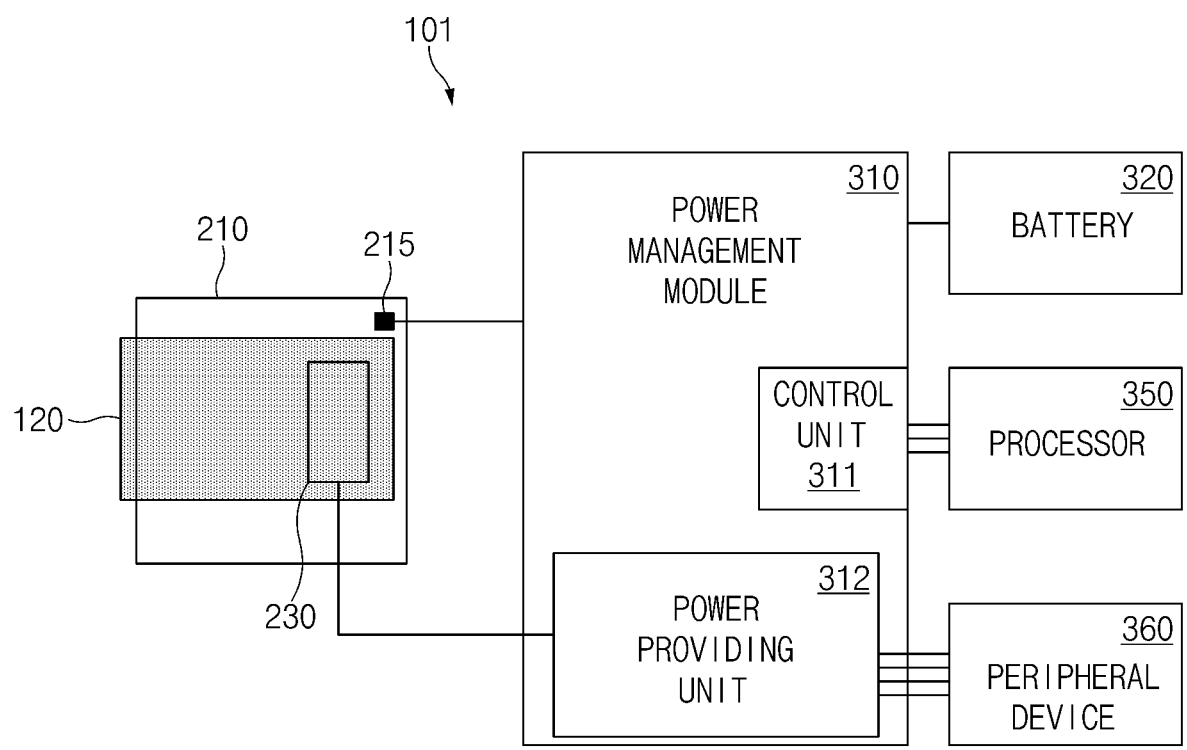
FIG. 3 is a configuration diagram of an electronic device related to power supply according to certain embodiments of the present disclosure.

FIG. 3 is a configuration diagram of an electronic device related to power supply according to certain embodiments of the present disclosure. FIG. 3 is a diagram mainly illustrating the configuration related to power supply; however, the present disclosure is not limited thereto.

Referring to FIG. 3, the electronic device 101 may include the tray 120, the socket 210, the power management module 310, a battery 320, a processor 350, and a peripheral device 360.

The power management module 310 may manage power supplied to components (e.g., the processor 350 and/or the peripheral device 360) included in the electronic device 101. According to an embodiment, the power management module 310 may be implemented as at least a part of, for example, a power management integrated circuit (PMIC).

According to an embodiment, the power management module 310 may identify state information related to charging or discharging of the battery 320 (e.g., life, overvoltage, undervoltage, overcurrent, overcharge, over discharge, overheat, and short circuit, or swelling). The power management module 310 may determine whether the battery 320 is normal or abnormal based at least in part on the identified state information. If determination is made that the state of the battery 320 is abnormal, the power management module 310 may adjust the charging of the battery 320 (e.g., charging current or voltage reduction, or charging stop).

According to an embodiment, at least some of the functions of the power management module 310 may be performed by an internal operation of the power management module 310 or by a control signal provided by the processor 350. The power management module 310 may adjust the power transmitted from the battery 320 to components (e.g., the processor 350 and the peripheral device 360) inside the electronic device 101 according to the internal operation or control of the processor 350.

According to an embodiment, the power management module 310 may generate a signal for cutting off or resetting power provided to the processor 350 or the peripheral device 360 inside the electronic device 101, based on the change in the signal (hereinafter, tray detection signal) transmitted via the first terminal 215 included in the socket 210. For example, the tray detection signal may be a signal that is generated or changed corresponding to the coupling or separating of the tray 120 and the socket 210. For another example, the tray detection signal may be a signal that is generated or changed by additional external pressure generated after the discharge of the tray 120.

According to certain embodiments of the present disclosure, if the tray 120 is coupled with the socket 210 by insertion, the tray detection signal (e.g., PWR On Signal) transmitted to the power management module 310 via the first terminal 215 may maintain a high state (a state of being equal to or greater than (or greater than) a specified voltage). In this case, the power management module 310 may perform an initialization sequence of the power management module 310 and a booting sequence of the electronic device 101 based on the tray detection signal.

According to another embodiment, if the tray 120 is separated from the socket 210, (or, after the tray 120 is separated from the socket 210, the contact state of first terminal 215 is changed by additional external pressure), the tray detection signal (e.g., PWR On Signal) transmitted to the power management module 310 via the first terminal 215 may be changed to a low state (a state of being less than (or equal to or less than) a specified voltage). The power management module 310 may perform a sequence of cutting off power provided to each component (e.g., the processor 350 and/or peripheral device 360) of the electronic device 101 immediately or after a specified time, based on the tray detection signal.

According to certain embodiments of the present disclosure, the tray 120 may include a second terminal (not illustrated) contacting the first terminal 215 in a state in which the tray 120 is coupled with the socket 210. If the tray 120 is separated from the socket 210, the first terminal 215 may be separated with the second terminal, and the tray detection signal transmitted to the power management module 310 via the first terminal 215 may be changed.

According to certain embodiments of the present disclosure, in the sequence related to power control, the power management module 310 may process the tray detection signal in preference to the control signal of the processor 350. This may mean that the tray detection signal is directly linked with the power management module. In this way, even if the processor 350 is out of control, the power management module 310 may efficiently cut off or reset the power of the electronic device 101 with the change in the tray detection signal which is forcibly generated by the user.

According to certain embodiments of the present disclosure, the power management module 310 may include a control unit 311 and a power providing unit 312.

The control unit (or first power providing unit) 311 may perform an operation related to power control. The control unit 311 may generate a signal for cutting off or resetting power provided to the processor 350 or the peripheral device 360 based on the change in the tray detection signal transmitted via the first terminal 215. In an embodiment, the control unit 311 may supply power to the processor 350. The controller 311 may supply or cut off power to the processor 350 based on the change in the tray detection signal. Furthermore, the control unit 311 may receive a control signal related to power management from the processor 350. The control unit 311 may adjust power provided to the peripheral device 360 corresponding to the control signal.

The power providing unit (or second power providing unit) 312 may change the power provided to the peripheral device 360 under the control of the control unit 311. The peripheral device 360 may be an element inside the electronic device 101 that operates by receiving power, such as a memory, a display, a communication circuit, and a sensor. The power providing unit 312 may even supply power to the SIM card 230 held in the tray 120. The power providing unit 312 may manage the peripheral devices 360 in grouping. For example, the power providing unit 312 may manage some of the peripheral devices 360 as a first group to simultaneously supply or cut off power. The power providing unit 312 may manage the other of the peripheral devices 360 as a second group to simultaneously supply or cut off power.

The battery 320 may supply power to at least one component of the electronic device 101 under the control of the power management module 310. According to an embodiment, the battery 320 may include, for example, a primary cell which is not rechargeable, a secondary cell which is rechargeable, or a fuel cell.

The processor 350 may perform operations required for the operation of the electronic device 101. The processor 350 may operate using power provided through the power management module 310. The processor 350 may transmit, to the power management module 310, a control signal related to providing power provided to the peripheral device 360.

The peripheral devices 360 may be various elements inside the electronic device 101 that operates by receiving power, such as a memory, a display, a communication circuit, and a sensor.

Figure 4:
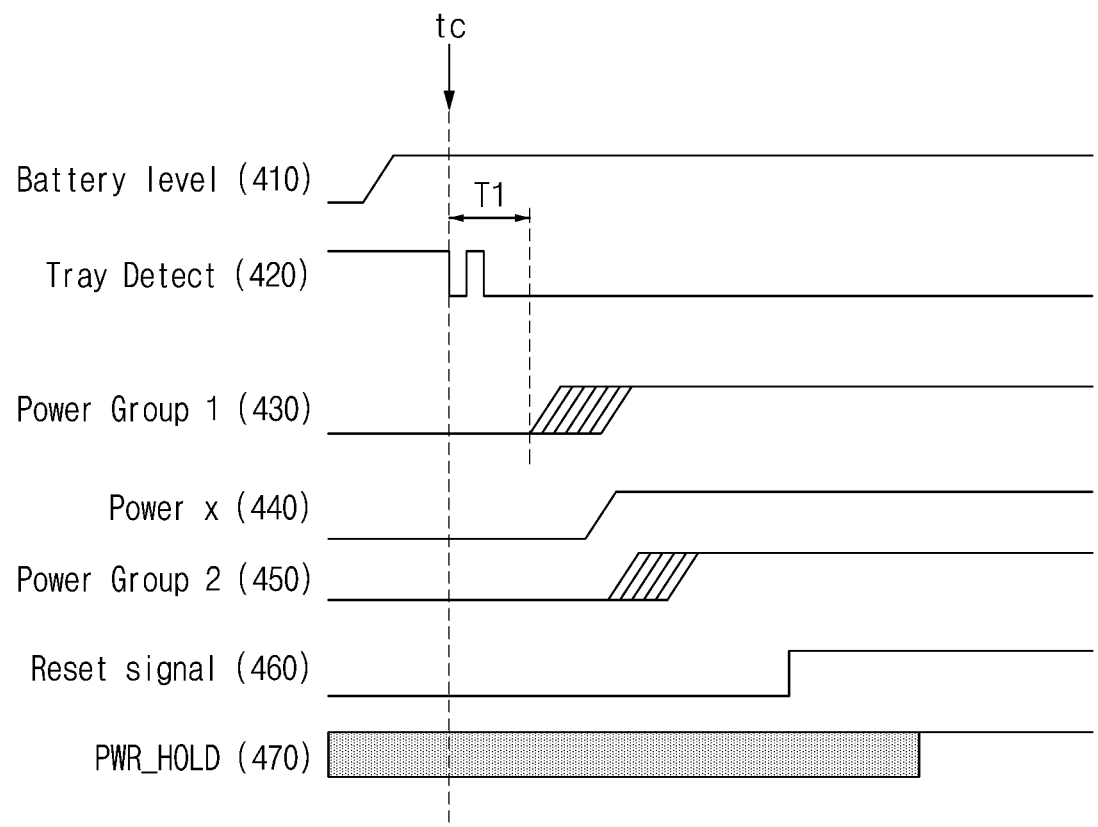
FIG. 4 is a signal flow diagram for power supply according to a tray detection signal according to certain embodiments of the present disclosure.

FIG. 4 is a signal flow diagram for power supply according to the tray detection signal according to certain embodiments of the present disclosure. FIG. 4 is example and is not limited thereto.

Referring to FIG. 4, if the power management module 310 is supplied with power from the battery 320, a battery power signal 410 may be changed from a first state (low state) to a second state (high state).

The power management module 310 may sense a change in a tray detection signal 420. The tray detection signal 420 may be a signal transmitted via the first terminal (or power sensing terminal) 215 of the socket 210. The power management module 310 may determine whether to transmit power supplied from the battery 320 to the internal configuration of the electronic device 101 based on the change in the tray detection signal 420.

If the tray 120 is coupled to the socket 210 by insertion (time "tc"), the tray detection signal 420 may be changed from a first state (e.g., a state of being equal to or greater than (or greater than) a specified voltage, high state) to a second state (e.g., a state of being less than (or equal to or less than) the specified voltage, low state). Hereinafter, the case will be mainly discussed in which the first state is the high state and the second state is the low state which is changed from the high state; however, the present disclosure is not limited thereto. For example, the first state may be the low state, and the second state may be the high state.

According to certain embodiments of the present disclosure, if the tray detection signal 420 is changed for the first time, the power management module 310 may wait for a specified waiting time T1. During the waiting time T1, the tray detection signal 420 may change between the first state and the second state temporarily depending on the coupling state of the tray 120 with the socket 210. The power management module 310 may wait for the tray detection signal 420 to stabilize for the specified waiting time T1.

If the tray detection signal 420 is changed from the first state (e.g., high state) to the second state (e.g., low state) and is maintained for the specified waiting time T1, the power management module 310 may sequentially supply power by changing the states (e.g., changing from the low signal to the high signal) of a first power signal 430 for the first group, a second power signal 440 for the specified element, a third power signal 450 for the second group, and so on in this order.

According to certain embodiments of the present disclosure, the power management module 310 may change the state of a reset signal 460 if the first to third power signals 430 to 450 are all changed from the first state (e.g., low state) to the second state (e.g., high state). The reset signal 460 may be a signal that initializes a state for the specified configuration. For example, the reset signal 460 may be changed from the first state (e.g., low state) to the second state (e.g., high state). The reset signal 460 may mean that the power management module 310 maintains a state in which normal power is supplied. In an embodiment, if a reset command signal is received from the processor 350, the power management module 310 may re-initialize the power state by changing the state of the reset signal 460.

According to certain embodiments of the present disclosure, the power management module 310 may maintain a power maintenance signal 470 in the first state (e.g., high state) while the first, second, and third power signals 430, 440, and 450 and the reset signal 460 are changed.

The state of the power maintenance signal 470 may be changed according to the tray detection signal 420. The tray detection signal 420 may have a higher priority than the power maintenance signal 470. If a command signal for changing the power state is received from the processor 350, the power management module 310 may change the states of the first, second, and third power signals 430, 440, and 450.

Figure 5:
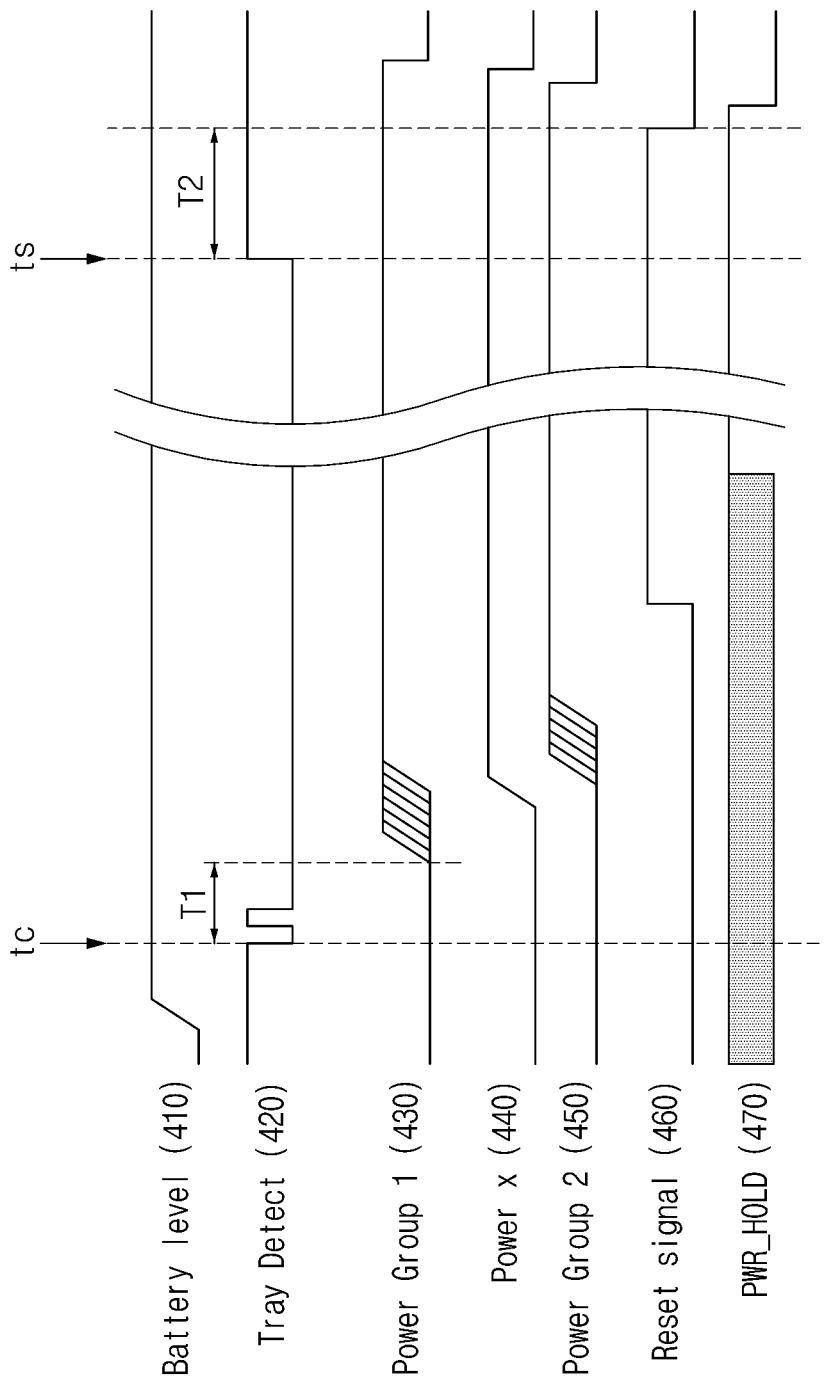
FIG. 5 is a signal flow diagram for power off according to the tray detection signal according to certain embodiments of the present disclosure.

FIG. 5 is a signal flow diagram for power off according to the tray detection signal according to certain embodiments of the present disclosure.

Referring to FIG. 5, the power management module 310 may sense a change in the tray detection signal 420. The tray detection signal 420 may be a signal transmitted via the first terminal 215 of the socket 210. The power management module 310 may determine whether to cut off power supplied from the battery 320 to the internal configuration of the electronic device 101 based on the change in the tray detection signal 420.

If the tray 120 is separated from the socket 210 (or an additional external pressure is generated after the separation of the tray 120) (time "ts"), the tray detection signal 420 may be changed from the second state (e.g., a state of being less than (or equal to or less than) the specified voltage, low state) to the first state (e.g., a state of being equal to or greater than (or greater than) the specified voltage, high state). In this case, the battery power signal 410 may continuously maintain the second state (high state) (power supply state).

The power management module 310 may change the tray detection signal 420 from the second state (e.g., low state) to the first state (e.g., high state) (time "ts"), and after a specified waiting time T2, may change the reset signal 460 from a second state (e.g., high state) to a first state (e.g., low state) and change the power maintenance signal 470 from a first state (e.g., high state) to a second state (e.g., low state).

Corresponding to the change in the reset signal 460 and/or the power maintenance signal 470, the power management module 310 may sequentially cut off power by changing the states (e.g., change from the high signal to the low signal) of the third power signal 450 for the second group, the second power signal 440 for the specified element, the first power signal 430 for the first group, and so on in this order.

According to certain embodiments of the present disclosure, the waiting time T2 may be variously set. The waiting time T2 may be changed according to a separate setting of the user or the state of the electronic device 101.

Figure 6:
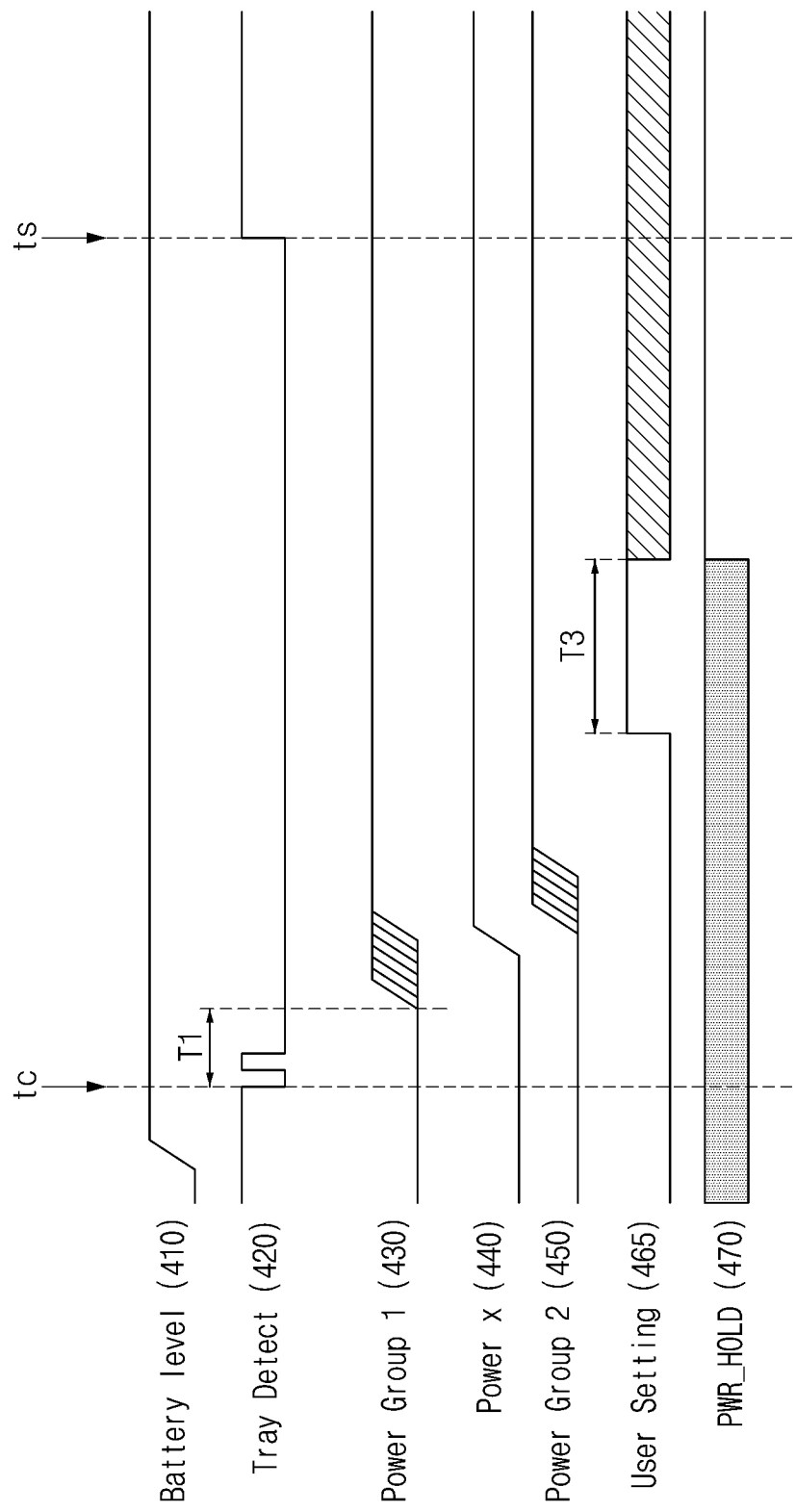
FIG. 6 is a diagram illustrating a reset signal by user setting according to certain embodiments of the present disclosure.

FIG. 6 is a diagram illustrating a reset signal by user setting according to certain embodiments of the present disclosure.

Referring to FIG. 6, if the tray 120 is coupled to the socket 210 (time "tc") by insertion, the tray detection signal 420 may be changed from the first state (e.g., a state of being equal to or greater than (or greater than) a specified voltage, high state) to the second state (e.g., a state of being less than (or equal to or less than) the specified voltage, low state). If the tray detection signal 420 is changed from the first state (e.g., high state) to the second state (e.g., low state), after waiting for the specified waiting time T1, the power management module 310 may sequentially supply power by changing the states (e.g., change states from the low signal to the high signal) of the first power signal 430 for the first group, the second power signal 440 for the specified element, and a third power signal 450 for the second group in this order.

If the first, second, and third power signals 430, 440, and 450 are all changed from the first state (e.g., low state) to the second state (e.g., high state), the power management module 310 may change a user-defined reset signal 465.

If the state of the user-defined reset signal 465 is changed (from the low state to the high state), a section to be processed according to a setting of the user may be entered after a specified waiting time T3. In the above section, regardless of the state change of the tray detection signal 420, the power management module 310 may re-initialize the power state according to a condition set by the user.

For example, if the tray 120 is separated from the socket 210 (or an additional external pressure is generated after the separation of the tray 120) (time "ts"), the tray detection signal 420 may be changed from the second state (e.g., a state of being less than (equal to or less than) the specified voltage, low state) to the first state (e.g., a state of being equal to or greater than (or greater than) the specified voltage, high state). In this case, the power management module 310 may maintain the existing state without changing the third power signal 450 for the second group, the second power signal 440 for the specified element, and the first power signal 430 for the first group (changing from the high signal to the low signal). The first, second, and third power signals 430, 440, and 450 may not be affected by the change in the tray detection signal 420. According to certain embodiments of the present disclosure, the power management module 310 may generate a signal (software reset) for resetting the power management module 310 (e.g., to the exclusion of other modules or systems) while maintaining the power supplied to the electronic device 101. For example, through the combination of the current state of the reset signal and the operation of the tray detection signal 420, the electronic device 101 may reset the power management module 310 depending on the insertion or removal of the tray 120, instead of cutting off power to the second group 450, the specified element 440, and the first group 430.

Figure 7A:
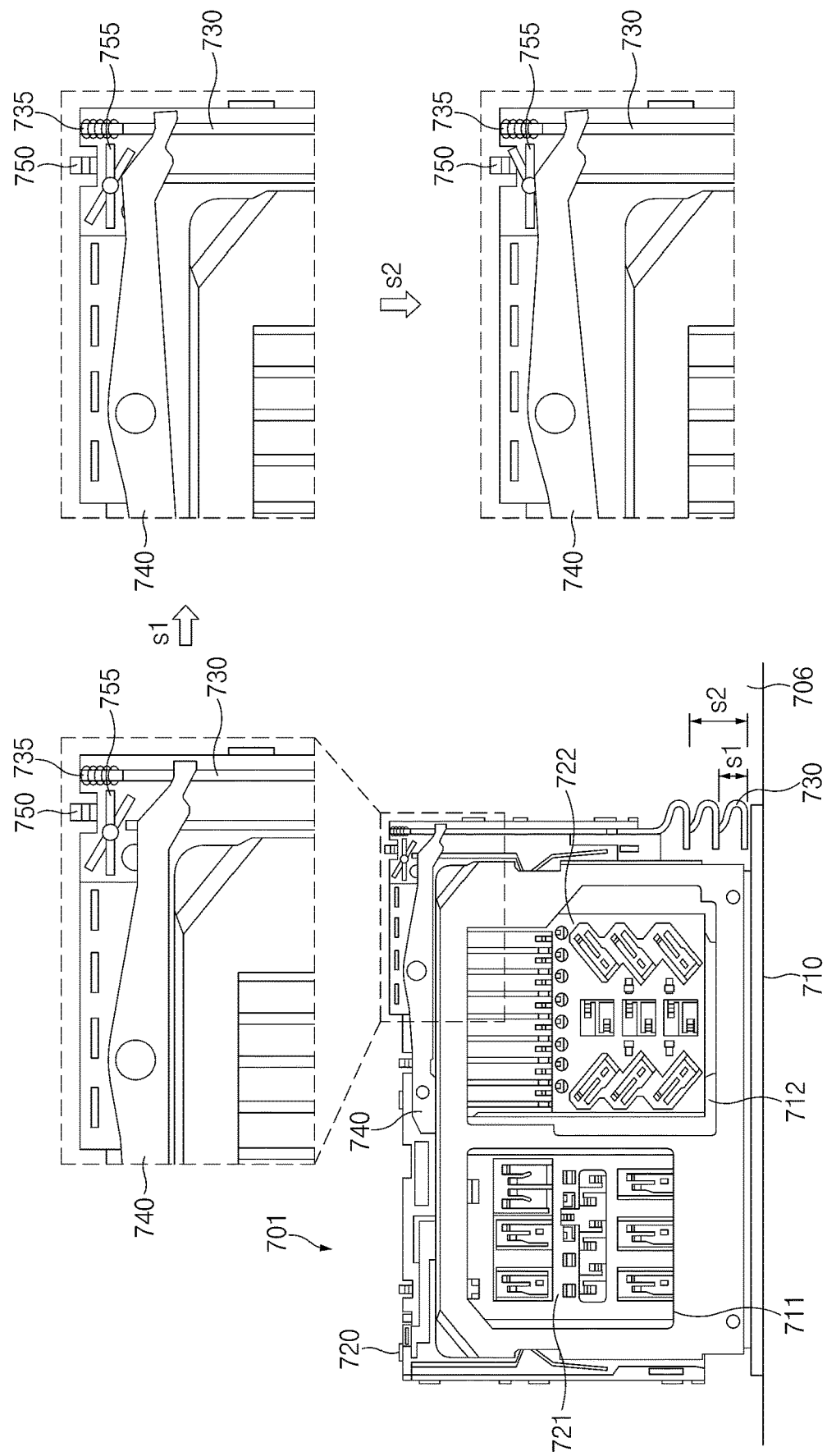
FIG. 7A is a structural diagram of a tray and a socket including a double pressing structure according to certain embodiments of the present disclosure.

FIG. 7A is a structural diagram of a tray and a socket including a double pressing structure according to certain embodiments of the present disclosure. FIG. 7A is example and is not limited thereto.

Referring to FIG. 7A, an electronic device 701 may include a socket 720 inside a housing 706. A tray 710 (e.g., the tray 120 of FIG. 2) may be inserted into the socket 720 (e.g., the socket 210 of FIG. 2). The tray 710 may include a first card region 711 and a second card region 712. The first card region 711 may be a region in which a first SIM card is held. The second card region 712 may be a hybrid type region that may hold two or more different types of cards. For example, the second card region 712 may be a region in which either a micro SD card or a second SIM card may be disposed.

The socket 720 may include a first contact region 721, a second contact region 722, a moving unit 730, a first rotating unit 740, a power sensing terminal 750, and a second rotating unit 755.

The first contact region 721 may be a region in electrical contact with the first SIM card held in the first card region 711. The second contact region 722 may be a region in electrical contact with the micro SD card or the second SIM card held in the second card region 712.

The moving unit 730 may move with the external pressure (e.g., pressure through an external pin). For example, when the moving unit 730 is pressed via application of force to the external pin, the moving unit 730 may be moved by a first distance s1. When the moving unit 730 moves by the first distance s1, the first rotating unit (or the tray discharge unit) 740 may be rotated. The tray 710 may be separated from the socket 720 by rotation of the first rotating unit 740. In this case, the state of the tray detection signal (e.g., the tray detection signal 420 of FIGS. 4 to 6) may not be changed.

According to certain embodiments of the present disclosure, when the moving unit 730 is pressed twice (or additionally) through the external pin in a state where the moving unit 730 has been pressed once through the external pin, the moving unit 730 may be moved by a second distance s2. When the moving unit 730 moves by the second distance s2, the second rotating unit 792 may be rotated. The second rotating unit 755 may be rotated by the pressure transmitted via the moving unit 730 or the first rotating unit 740.

According to certain embodiments of the present disclosure, when the moving unit 730 is pressed twice (or additionally) through the external pin in the state where the moving unit 730 has been pressed once through the external pin, the moving unit 730 may be supported through a separate elastic portion 735 (e.g., spring). The elastic portion 735 may generate a force that pushes the moving portion 730 outward. The user may compress the elastic portion 735 by generating a secondary pressure greater than a primary pressure, and may thus change the state of the tray detection signal (e.g., the tray detection signal 420 of FIGS. 4 to 6).

The power sensing terminal 750 may be electrically connected to the power management module 310 inside the electronic device. In a state where the tray 710 is coupled to the socket 720, and a separate external pressure is not generated in the moving unit 730, the power sensing terminal 750 may transmit a signal of the first state (e.g., high state) to the power management module. If the tray 710 is separated from the socket 720 and a separate external pressure is generated in the moving unit 730, the power sensing terminal 750 may transmit a signal of the second state (e.g., low state) to the power management module.

The second rotating unit 755 may rotate by the pressure transmitted via the moving unit 730 or the first rotating unit 740. The state of the tray detection signal (e.g., the tray detection signal 420 of FIGS. 4 to 6) transmitted via the power sensing terminal 750 (e.g., the first terminal (or tray detection terminal, power management terminal) 215 of FIG. 2) may be changed by rotation of the second rotating unit 755.

When the second rotating unit 755 rotates, the contact state of the power sensing terminal 750 may be changed. For example, when the second rotating unit 755 rotates, the power sensing terminal 750 may be pressed, and with the movement of the power sensing terminal 750, a separate conductor may be changed from the connected state to the disconnected state. Alternatively, with the movement of the power sensing terminal 750, a separate physical switch may be changed from an on state to an off state. In this way, the state of the tray detection signal (e.g., the tray detection signal 420 of FIGS. 4 to 6) transmitted to the power management module may be changed.

For another example, when the second rotating unit 755 rotates, a contact state between a separate terminal formed on the second rotating unit 755 and the power sensing terminal 750 may be released. In this way, the state of the tray detection signal (e.g., the tray detection signal 420 of FIGS. 4 to 6) transmitted to the power management module may be changed.

According to certain embodiments of the present disclosure, the moving unit 730 may be pressed through an object other than the pin. For example, the tray 710 may include a slit larger than a pinhole, through which a coin or a user's nail may be introduced. The user may press the moving unit 730 through the slit.

Figure 7B:
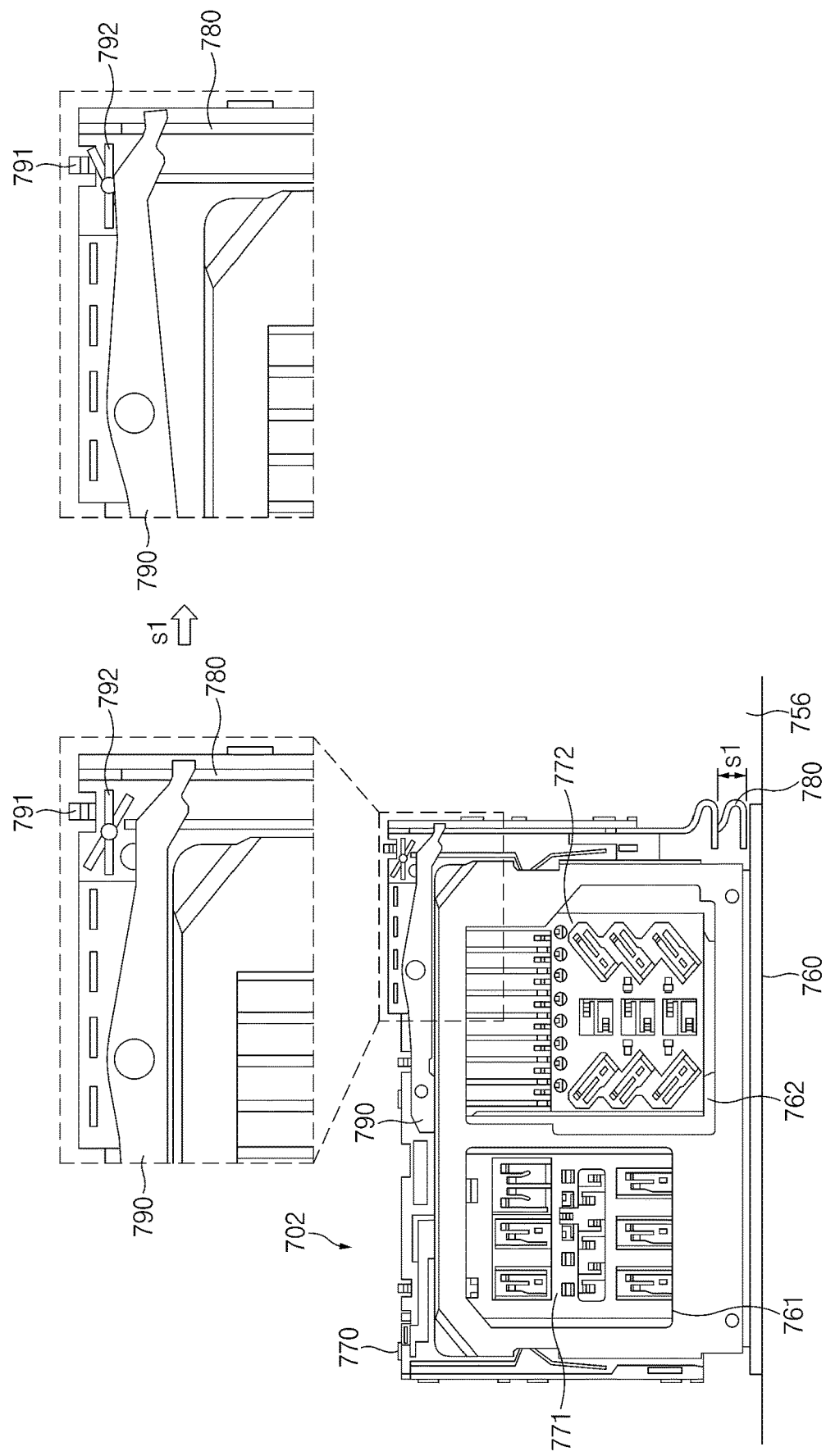
FIG. 7B is a structural diagram of a tray and a socket including a single pressing structure according to certain embodiments of the present disclosure.

FIG. 7B is a structural diagram of a tray and a socket including a single pressing structure according to certain embodiments of the present disclosure.

Referring to FIG. 7B, an electronic device 702 may include a socket 770 inside a housing 756. A tray 760 (e.g., the tray 120 of FIG. 2) may be inserted into the socket 770 (e.g., the socket 210 of FIG. 2). The tray 760 may include a first card region 761 and a second card region 762.

The socket 770 may include a first contact region 771, a second contact region 772, a moving unit 780, a first rotating unit 790, and a power sensing terminal 791 (e.g., the first terminal 215 (or tray detection terminal, power management terminal) 215 of FIG. 2), and a second rotating unit 792.

The moving unit 780 may move with the external pressure (e.g., pressure through an external pin). For example, when the moving unit 780 is pressed through the external pin, the moving unit 780 may be moved by the first distance s1. When the moving unit 780 moves by the first distance s1, the first rotating unit (or the tray discharge unit) 790 may be rotated. The tray 760 may be separated from the socket 770 by rotation of the first rotating unit 740. When the moving unit 780 moves by the first distance s1, the second rotating unit 792 may be rotated. The second rotating unit 792 may rotate by the pressure transmitted via the moving unit 780 or the first rotating unit 790.

The power sensing terminal 791 may be electrically connected to the power management module (e.g., the power management module 310 of FIG. 3) inside the electronic device. If the tray 760 and the socket 770 are coupled, the power sensing terminal 791 may transmit a signal in the first state (e.g., high state) to the power management module. If the tray 760 and the socket 770 are separated, the power sensing terminal 791 may transmit a signal of the second state (e.g., low state) to the power management module.

The second rotating unit 792 may rotate by the pressure transmitted via the moving unit 780 or the first rotating unit 790. The state of the tray detection signal (e.g., the tray detection signal 420 of FIGS. 4 to 6) transmitted via the power sensing terminal 791 (e.g., the first terminal (or tray detection terminal, power management terminal) 215 of FIG. 2) may be changed by rotation of the second rotating unit 792.

Figure 8:
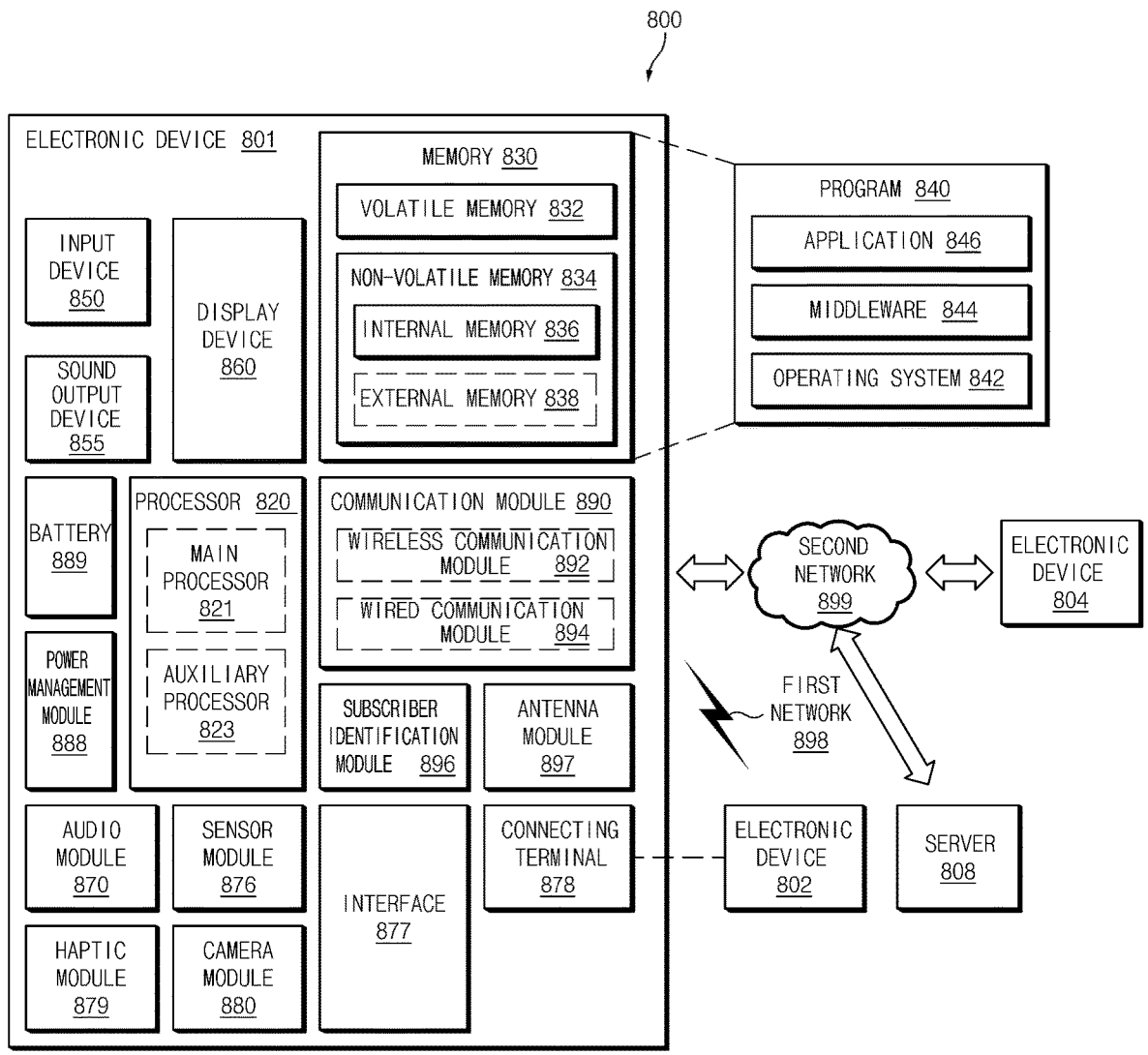
FIG. 8 is a block diagram of an electronic device in a network environment according to certain embodiments of the present disclosure.

FIG. 8 is a block diagram of an electronic device 801 in a network environment 800, according to certain embodiments. Referring to FIG. 8, the electronic device 801 in the network environment 800 may communicate with an electronic device 802 over a first network 898 (e.g., a short range wireless communication network) or may communicate with an electronic device 804 or a server 808 over a second network 899 (e.g., a long distance wireless communication network). According to an embodiment, the electronic device 801 may communicate with the electronic device 804 through the server 808. According to an embodiment, the electronic device 801 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a subscriber identification module 896, or an antenna module 897. In any embodiment, at least one (e.g., the display device 860 or the camera module 880) of the components may be omitted from the electronic device 801, or one or more other components may be further included in the electronic device 801. In any embodiment, some of the components may be implemented with a single integrated circuit. For example, the sensor module 876 (e.g., a fingerprint sensor, an iris sensor, or an illumination sensor) may be embedded in the display device 860 (e.g., a display).

The processor 820 may execute, for example, software (e.g., a program 840) to control at least one other component (e.g., a hardware or software component) of the electronic device 801 connected to the processor 820, and may perform various data processing or operations. According to an embodiment, as at least a part of the data processing or operations, the processor 820 may load a command or data received from any other component (e.g., the sensor module 876 or the communication module 890) to a volatile memory 832, may process the command or data stored in the volatile memory 832, and may store processed data in a nonvolatile memory 834. According to an embodiment, the processor 820 may include a main processor 821 (e.g., a central processing unit or an application processor) and an auxiliary processor 823 (e.g., a graphic processing device, an image signal processor, a sensor hub processor, or a communication processor), which may be operated independently of or together with the main processor 821. Additionally or alternatively, the auxiliary processor 823 may be configured to use lower power than the main processor 821 or to be specialized for a specified function. The auxiliary processor 823 may be implemented separately from the main processor 821 or may be implemented as a part of the main processor 821.

The auxiliary processor 823 may control at least a part of a function or states associated with at least one component (e.g., the display device 860, the sensor module 876, or the communication module 890) of the electronic device 801, for example, instead of the main processor 821 while the main processor 821 is in an inactive (e.g., sleep) state and together with the main processor 821 while the main processor 821 is in an active (e.g., an application execution) state. According to an embodiment, the auxiliary processor 823 (e.g., an image signal processor or a communication processor) may be implemented as a part of any other component (e.g., the camera module 880 or the communication module 890) which is functionally (or operatively) associated with the auxiliary processor 823.

The memory 830 may store various data which are used by at least one component (e.g., the processor 820 or the sensor module 876) of the electronic device 801. The data may include, for example, software (e.g., the program 840), or input data or output data associated with a command of the software. The memory 830 may include the volatile memory 832 or the nonvolatile memory 834.

The program 840 may be stored in the memory 830 as software, and may include, for example, an operating system 842, a middleware 844, or an application 846.

The input device 850 may receive a commands or data which will be used by a component (e.g., the processor 820) of the electronic device 801, from the outside (e.g., a user) of the electronic device 801. The input device 850 may include, for example, a microphone, a mouse, or a keyboard.

The sound output device 855 may output a sound signal to the outside of the electronic device 801. The sound output device 855 may include, for example, a speaker or a receiver. The speaker may be used for a general purpose such as multimedia play or recording play, and the receiver may be used to receive an incoming call. According to an embodiment, the receiver may be implemented separately from the speaker or may be implemented as a part of the speaker.

The display device 860 may visually provide information to the outside (e.g., the user) of the electronic device 801. The display device 860 may include, for example, a display, a hologram device, or a control circuit for controlling a projector and a corresponding device. According to an embodiment, the display device 860 may include a touch circuitry configured to sense a touch, or a sensor circuitry (e.g., a pressure sensor) configured to measure the strength of force generated by the touch.

The audio module 870 may convert sound to an electrical signal, or reversely, may convert an electrical signal to sound. According to an embodiment, the audio module 870 may obtain sound through the input device 850, or may output sound through the sound output device 855, or through an external electronic device (e.g., the electronic device 802) (e.g., a speaker or a headphone) directly or wirelessly connected with the electronic device 801.

The sensor module 876 may sense an operation state (e.g., power or a temperature) of the electronic device 801 or an external environment state (e.g., a user state), and may generate an electrical signal or a data value corresponding the sensed state. According to an embodiment, the sensor module 876 may include, for example, a gesture sensor, a grip sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illumination sensor.

The interface 877 may support one or more specified protocols that may be used to directly and wirelessly connect the electronic device 801 with an external electronic device (e.g., the electronic device 802). According to an embodiment, the interface 877 may include, for example, a high definition multimedia interface (HDMI), a universal serial bus (USB) interface, a secure digital (SD) card interface, or an audio interface.

A connection terminal 878 may include a connector that may allow the electronic device 801 to be physically connected with an external electronic device (e.g., the electronic device 802). According to an embodiment, the connection terminal 878 may include, for example, a HDMI connector, a USB connector, a SD card connector, or an audio connector (e.g., a headphone connector).

The haptic module 879 may convert an electrical signal to a mechanical stimulation (e.g., vibration or movement) or an electrical stimulation which the user may perceive through the sense of touch or the sense of movement. According to an embodiment, the haptic module 879 may include, for example, a motor, a piezoelectric sensor, or an electrical stimulation device.

The camera module 880 may photograph a still image and a video. According to an embodiment, the camera module 880 may include one or more lenses, image sensors, image signal processors, or flashes (or electrical flashes).

The power management module 888 may manage the power which is supplied to the electronic device 801. According to an embodiment, the power management module 888 may be implemented, for example, as at least a part of a power management integrated circuit (PMIC).

The battery 889 may power at least one component of the electronic device 801. According to an embodiment, the battery 889 may include, for example, a primary cell not recharged, a secondary cell rechargeable, or a fuel cell.

The communication module 890 may establish a direct (or wired) communication channel or a wireless communication channel between the electronic device 801 and an external electronic device (e.g., the electronic device 802, the electronic device 804, or the server 808) or may perform communication through the established communication channel. The communication module 890 may include one or more communication processors which is operated independently of the processor 820 (e.g., an application processor) and supports direct (or wired) communication or wireless communication. According to an embodiment, the communication module 890 may include a wireless communication module 892 (e.g., a cellular communication module, a short range wireless communication module, or a global navigation satellite system (GNSS) communication module) or a wired communication module 894 (e.g., a local area network (LAN) communication module or a power line communication module). A corresponding communication module of such communication modules may communicate with an external electronic device over the first network 898 (e.g., a short range communication network such as Bluetooth, Wi-Fi direct, or infrared data association (IrDA)) or the second network 899 (e.g., a long distance communication network such as a cellular network, an Internet, or a computer network (e.g., LAN or WAN)). The above-described kinds of communication modules may be integrated in one component (e.g., a single chip) or may be implemented with a plurality of components (e.g., a plurality of chips) which are independent of each other. The wireless communication module 892 may verify and authenticate the electronic device 801 within a communication network, such as the first network 898 or the second network 899, by using subscriber information (e.g., international mobile subscriber identity (IMSI)) stored in the subscriber identification module 896.

The antenna module 897 may transmit a signal or a power to the outside (e.g., an external electronic device) or may receive a signal or a power from the outside. According to an embodiment, the antenna module 897 may include one or more antennas, and at least one antenna which is suitable for a communication scheme used in a computer network such as the first network 898 or the second network 899 may be selected, for example, by the communication module 890 from the one or more antennas. The signal or power may be exchanged between the communication module 890 and an external electronic device through the selected at least one antenna or may be received from the external electronic device through the selected at least one antenna and the communication module 890.

At least some of the components may be connected to each other through a communication scheme (e.g., a bus, a general purpose input and output (GPIO), a serial peripheral interface (SPI), or a mobile industry processor interface (MIPI)) between peripheral devices and may exchange signals (e.g., commands or data) with each other.

According to an embodiment, a command or data may be transmitted or received (or exchanged) between the electronic device 801 and the external electronic device 804 through the server 808 connecting to the second network 899. Each of the electronic devices 802 and 804 may be a device, the kind of which is the same as or different from a kind of the electronic device 801. According to an embodiment, all or a part of operations to be executed in the electronic device 801 may be executed in one or more external devices of the external electronic devices 802, 804, or 808. For example, in the case where the electronic device 801 should perform any function or service automatically or in response to a request from the user or any other device, the electronic device 801 may request one or more external electronic devices to perform at least a part of the function or service, instead of internally executing the function or service or additionally. The one or more external electronic devices which receive the request may execute at least a part of the function or service thus requested or an additional function or service associated with the request, and may provide a result of the execution to the electronic device 801. The electronic device 801 may process received result as it is or additionally, and may provide a result of the processing as at least a part of the response to the request. To this end, for example, a cloud computing, distributed computing, or client-server computing technology may be used.

According to certain embodiments of the present disclosure, an electronic device (e.g., the electronic device 101 of FIG. 1, the electronic device 701 of FIG. 7A, the electronic device 702 of FIG. 7B, or the electronic device 801 of FIG. 8) may include a housing (e.g., the housing 106 of FIG. 1, the housing 706 of FIG. 7A, or the housing 756 of FIG. 7B) including an opening (e.g., the opening 110 of FIG. 1) on at least one surface, a socket (e.g., the socket 210 of FIG. 2, the socket 720 of FIG. 7A, or the socket 770 of FIG. 7B) disposed to be adjacent to the opening (e.g., the opening 110 of FIG. 1) in the housing (e.g., the housing 106 of FIG. 1, the housing 706 of FIG. 7A, or the housing 756 of FIG. 7B), a tray (e.g., the tray 120 of FIG. 1, the tray 710 of FIG. 7A, or the tray 760 of FIG. 7B) inserted into the socket (e.g., the socket 210 of FIG. 2, the socket 720 of FIG. 7A, or the socket 770 of FIG. 7B) through the opening (e.g., the opening 110 of FIG. 1) and capable of holding one or more cards, a battery (e.g., the battery 320 of FIG. 3 or the battery 889 of FIG. 8), and a power management module (e.g., the power management module 310 of FIG. 3 or the power management module 888 of FIG. 8) configured to control power provided from the battery (e.g., the battery 320 of FIG. 3 or the battery 889 of FIG. 8). The socket (e.g., the socket 210 of FIG. 2, the socket 720 of FIG. 7A, or the socket 770 of FIG. 7B) may include a first terminal (e.g., the first terminal 215 of FIG. 3, the power sensing terminal 750 of FIG. 7A, or the power sensing terminal 791 of FIG. 7B) connected to the power management module (e.g., the power management module 310 of FIG. 3 or the power management module 888 of FIG. 8), and the power management module may control power provided to at least one element inside the electronic device (e.g., the electronic device 101 of FIG. 1, the electronic device 701 of FIG. 7A, the electronic device 702 of FIG. 7B, or the electronic device 801 of FIG. 8) from the battery (e.g., the battery 320 of FIG. 3 or the battery 889 of FIG. 8) based on a first signal sensed via the first terminal (e.g., the first terminal 215 of FIG. 3, the power sensing terminal 750 of FIG. 7A, or the power sensing terminal 791 of FIG. 7B).

According to certain embodiments of the present disclosure, if the tray (e.g., the tray 120 of FIG. 1, the tray 710 of FIG. 7A, or the tray 760 of FIG. 7B) is coupled with the socket (e.g., the socket 210 of FIG. 2, the socket 720 of FIG. 7A, or the socket 770 of FIG. 7B) by the change from a state of being separated from the socket, the first signal may be changed from a first state to a second state, and if the tray (e.g., the tray 120 of FIG. 1, the tray 710 of FIG. 7A, or the tray 760 of FIG. 7B) is separated from the socket (e.g., the socket 210 of FIG. 2, the socket 720 of FIG. 7A, or the socket 770 of FIG. 7B) by the change from a state of being coupled with the socket, the first signal may be changed from the second state to the first state.

According to certain embodiments of the present disclosure, the power management module (e.g., the power management module 310 of FIG. 3 or the power management module 888 of FIG. 8) may supply power to the at least one element after a specified first waiting time if the first signal is changed from the first state to the second state. The power management module (e.g., the power management module 310 of FIG. 3 or the power management module 888 of FIG. 8) may classify the at least one element into a first group and a second group, and may supply power to the second group after power is supplied to the first group. The power management module (e.g., the power management module 310 of FIG. 3 or the power management module 888 of FIG. 8) may change a state of a signal for resetting the at least one element after power is supplied to the at least one element.

According to certain embodiments of the present disclosure, the first state may be a state in which the first signal is equal to or greater than a specified voltage, and the second state may be a state in which the first signal is less than the specified voltage.

According to certain embodiments of the present disclosure, the power management module (e.g., the power management module 310 of FIG. 3 or the power management module 888 of FIG. 8) may at least temporarily cut off power supplied to the at least one element after a specified second waiting time if the first signal is changed from the second state to the first state. The power management module (e.g., the power management module 310 of FIG. 3 or the power management module 888 of FIG. 8) may classify the at least one element into a first group and a second group, and may supply power to the first group and cut off power to the second group if the first signal is changed from the second state to the first state.

According to certain embodiments of the present disclosure, the power management module (e.g., the power management module 310 of FIG. 3 or the power management module 888 of FIG. 8) may reset a state of the power management module (e.g., the power management module 310 of FIG. 3 or the power management module 888 of FIG. 8) in a state in which power supplied to the at least one element is maintained after a specified second waiting time, if the first signal is changed from the second state to the first state.

According to certain embodiments of the present disclosure, the power management module (e.g., the power management module 310 of FIG. 3 or the power management module 888 of FIG. 8) may change an entire configuration of the electronic device (e.g., the electronic device 101 of FIG. 1, the electronic device 701 of FIG. 7A, the electronic device 702 of FIG. 7B, or the electronic device 801 of FIG. 8) to a power-off state if the first signal is changed from the second state to the first state.

According to certain embodiments of the present disclosure, the power management module (e.g., the power management module 310 of FIG. 3 or the power management module 888 of FIG. 8) may sense a change in the second signal according to the setting of a user, and may maintain power supplied to the at least one element if the first signal is changed from the second state to the first state.

According to certain embodiments of the present disclosure, the electronic device (e.g., the electronic device 101 of FIG. 1, the electronic device 701 of FIG. 7A, the electronic device 702 of FIG. 7B, or the electronic device 801 of FIG. 8) may further include a processor (e.g., the processor 350 of FIG. 3 or the processor 820 of FIG. 8) configured to control the power management module (e.g., the power management module 310 of FIG. 3 or the power management module 888 of FIG. 8), and the power management module (e.g., the power management module 310 of FIG. 3 or the power management module 888 of FIG. 8) may process the first signal in preference to a power control signal transmitted from the processor (e.g., the processor 350 of FIG. 3 or the processor 820 of FIG. 8).

An electronic device (e.g., the electronic device 101 of FIG. 1, the electronic device 701 of FIG. 7A, the electronic device 702 of FIG. 7B, or the electronic device 801 of FIG. 8) according to certain embodiments of the present disclosure may include a housing (e.g., the housing 106 of FIG. 1, the housing 706 of FIG. 7A, or the housing 756 of FIG. 7B) including an opening (e.g., the opening 110 of FIG. 1) on at least one surface, a socket (e.g., the socket 210 of FIG. 2, the socket 720 of FIG. 7A, or the socket 770 of FIG. 7B) disposed to be adjacent to the opening (e.g., the opening 110 of FIG. 1) in the housing (e.g., the housing 106 of FIG. 1, the housing 706 of FIG. 7A, or the housing 756 of FIG. 7B), a tray (e.g., the tray 120 of FIG. 1, the tray 710 of FIG. 7A, or the tray 760 of FIG. 7B) inserted into the socket (the socket 210 of FIG. 2, the socket 720 of FIG. 7A, or the socket 770 of FIG. 7B) through the opening (e.g., the opening 110 of FIG. 1) and capable of holding one or more cards, a battery (e.g., the battery 320 of FIG. 3 or the battery 889 of FIG. 8), and a power management module (e.g., the power management module 310 of FIG. 3 or the power management module 888 of FIG. 8) electrically connected with the socket (e.g., the socket 210 of FIG. 2, the socket 720 of FIG. 7A, or the socket 770 of FIG. 7B) and configured to control power provided from the battery (e.g., the battery 320 of FIG. 3 or the battery 889 of FIG. 8). The socket (e.g., the socket 210 of FIG. 2, the socket 720 of FIG. 7A, or the socket 770 of FIG. 7B) may include a first terminal (e.g., the first terminal 215 of FIG. 3, the power sensing terminal 750 of FIG. 7A, or the power sensing terminal 791 of FIG. 7B) connected to the power management module (e.g., the power management module 310 of FIG. 3 or the power management module 888 of FIG. 8), a moving unit that is movable when a force is applied by an external pressure, and a tray (e.g., the tray 120 of FIG. 1, the tray 710 of FIG. 7A, or the tray 760 of FIG. 7B) discharge unit separating the tray (e.g., the tray 120 of FIG. 1, the tray 710 of FIG. 7A, or the tray 760 of FIG. 7B) from the socket (e.g., the socket 210 of FIG. 2, the socket 720 of FIG. 7A, or the socket 770 of FIG. 7B) through a force transmitted through the moving unit, the moving unit may transmit the force by the external pressure to the tray (e.g., the tray 120 of FIG. 1, the tray 710 of FIG. 7A, or the tray 760 of FIG. 7B) discharge unit when the moving unit moves by a first distance by the external pressure, the tray (e.g., the tray 120 of FIG. 1, the tray 710 of FIG. 7A, or the tray 760 of FIG. 7B) discharge unit may move the tray (e.g., the tray 120 of FIG. 1, the tray 710 of FIG. 7A, or the tray 760 of FIG. 7B) to an outside of the electronic device (e.g., the electronic device 101 of FIG. 1, the electronic device 701 of FIG. 7A, the electronic device 702 of FIG. 7B, or the electronic device 801 of FIG. 8) through the opening (e.g., the opening 110 of FIG. 1), and the power management module may control power provided to at least one element inside the electronic device (e.g., the electronic device 101 of FIG. 1, the electronic device 701 of FIG. 7A, the electronic device 702 of FIG. 7B, or the electronic device 801 of FIG. 8) from the battery (e.g., the battery 320 of FIG. 3 or the battery 889 of FIG. 8) based on a change in the first signal with movement of the moving unit, the change being sensed via the first terminal (e.g., the first terminal 215 of FIG. 3, the power sensing terminal 750 of FIG. 7A, or the power sensing terminal 791 of FIG. 7B).

According to certain embodiments of the present disclosure, a contact state of the first terminal (e.g., the first terminal 215 of FIG. 3, the power sensing terminal 750 of FIG. 7A, or the power sensing terminal 791 of FIG. 7B) of the socket (e.g., the socket 210 of FIG. 2, the socket 720 of FIG. 7A, or the socket 770 of FIG. 7B) may be changed when the moving unit moves by a second distance by an additional pressure in a state in which the moving unit has moved by the first distance by the external pressure.

According to certain embodiments of the present disclosure, the socket (e.g., the socket 210 of FIG. 2, the socket 720 of FIG. 7A, or the socket 770 of FIG. 7B) may include an elastic portion connected to the moving unit, and the elastic portion may push the moving unit outward of the electronic device (e.g., the electronic device 101 of FIG. 1, the electronic device 701 of FIG. 7A, the electronic device 702 of FIG. 7B, or the electronic device 801 of FIG. 8) when the moving unit moves by the second distance.

According to certain embodiments of the present disclosure, the socket (e.g., the socket 210 of FIG. 2, the socket 720 of FIG. 7A, or the socket 770 of FIG. 7B) may further include a rotating unit that is rotatable by the force transmitted through the moving unit or the tray (e.g., the tray 120 of FIG. 1, the tray 710 of FIG. 7A, or the tray 760 of FIG. 7B) discharge unit, and a contact state of the first terminal (e.g., the first terminal 215 of FIG. 3, the power sensing terminal 750 of FIG. 7A, or the power sensing terminal 791 of FIG. 7B) may be changed by rotation of the rotating unit.

According to certain embodiments of the present disclosure, the socket (e.g., the socket 210 of FIG. 2, the socket 720 of FIG. 7A, or the socket 770 of FIG. 7B) may further include a switch of which a state is changed by the force transmitted through the moving unit or the tray (e.g., the tray 120 of FIG. 1, the tray 710 of FIG. 7A, or the tray 760 of FIG. 7B) discharge unit, and a contact state of the first terminal (e.g., the first terminal 215 of FIG. 3, the power sensing terminal 750 of FIG. 7A, or the power sensing terminal 791 of FIG. 7B) may be changed according to a change in the state of the switch between on and off.

According to certain embodiments of the present disclosure, the tray (e.g., the tray 120 of FIG. 1, the tray 710 of FIG. 7A, or the tray 760 of FIG. 7B) may include a first card region and a second card region, and at least one of the first card region and the second card region may be a hybrid type capable of holding one of a plurality of different cards.

According to certain embodiments of the present disclosure, the tray (e.g., the tray 120 of FIG. 1, the tray 710 of FIG. 7A, or the tray 760 of FIG. 7B) may include a second terminal contacting the first terminal (e.g., the first terminal 215 of FIG. 3, the power sensing terminal 750 of FIG. 7A, or the power sensing terminal 791 of FIG. 7B).

According to certain embodiments of the present disclosure, the housing (e.g., the housing 106 of FIG. 1, the housing 706 of FIG. 7A, or the housing 756 of FIG. 7B) may be implemented in a keyless form in which a separate physical button is not included.

An electronic device according to certain embodiments of the present disclosure may include at least one of a smartphone, a tablet personal computer (PC), a mobile phone, a video telephone, an electronic book reader, a desktop PC, a laptop PC, a netbook computer, a workstation, a server, personal digital assistant (PDA), a portable multimedia player (PMP), a Motion Picture Experts Group (MPEG-1 or MPEG-2) Audio Layer 3 (MP3) player, a mobile medical device, a camera, or a wearable device. According to certain embodiments, a wearable device may include at least one of an accessory type of device (e.g., a timepiece, a ring, a bracelet, an anklet, a necklace, glasses, a contact lens, or a head-mounted device (HMD)), a one-piece fabric or clothes type of device (e.g., electronic clothes), a body-attached type of device (e.g., a skin pad or a tattoo), or a bio-implantable type of device (e.g., implantable circuit). According to certain embodiments, the electronic device may include at least one of, for example, televisions (TVs), digital versatile disk (DVD) players, audios, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment, the electronic device may include at least one of navigation devices, satellite navigation system (e.g., Global Navigation Satellite System (GNSS)), event data recorders (EDRs) (e.g., black box for a car, a ship, or a plane), vehicle infotainment devices (e.g., head-up display for vehicle), industrial or home robots, drones, automatic teller's machines (ATMs), points of sales (POSs), measuring instruments (e.g., water meters, electricity meters, or gas meters), or internet of things (e.g., light bulbs, sprinkler devices, fire alarms, thermostats, or street lamps). The electronic device according to an embodiment of this disclosure may not be limited to the above-described devices, and may provide functions of a plurality of devices like smartphones which has measurement function of personal biometric information (e.g., heart rate or blood glucose). In this disclosure, the term "user" may refer to a person who uses an electronic device or may refer to a device (e.g., an artificial intelligence electronic device) that uses the electronic device.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
a housing including an opening defined on at least one surface of the housing;
a socket adjacent to the opening in the housing;
a tray insertable into the socket through the opening and configured to hold one or more cards;
a battery;
a power management circuit configured to control power provided from the battery, and
a first terminal connected to the power management circuit, the first terminal included in the socket,
wherein the power management circuit is configured to control a provision of power from the battery to at least one internal component of the electronic device based on a first signal detected via the first terminal.

2. The electronic device of claim 1, wherein when the tray is coupled to the socket by insertable into the socket, the first signal changes from a first state to a second state, and
when the tray is decoupled by removal from the socket, the first signal changes from the second state to the first state.

3. The electronic device of claim 2, wherein the power management module is configured to:
initiate a supply power to the at least one internal component after a lapse of a first predefined waiting time beginning from a first time point at which the first signal changes from the first state to the second state.

4. The electronic device of claim 3, wherein the electronic device includes a plurality of internal components, and the power management circuit is configured to:
classify each of the plurality of internal components into at least a first group and a second group; and
supply power to internal components of the second group, after supplying power to internal components of the first group.

5. The electronic device of claim 3, wherein the power management circuit is configured to:
after power is supplied to the at least one element, change a state of a signal for resetting the at least one element.

6. The electronic device of claim 2, wherein:
in the first state, the first signal is equal to or greater than a prespecified voltage, and
in the second state, the first signal is less than the prespecified voltage.

7. The electronic device of claim 2, wherein the power management circuit is configured to:
terminate the supply of power to the at least one internal component after a lapse of a second predefined waiting time beginning from a second time point at which the first signal changes from the second state to the first state.

8. The electronic device of claim 7, wherein the electronic device includes a plurality of internal components, and the power management circuit is configured to:
classify each of the plurality of internal components into at least a first group and a second group; and
supply power to the internal components of the first group and terminate the supply of power to the second group, when the first signal changes from the second state to the first state.

9. The electronic device of claim 2, wherein the power management circuit is configured to:
detect that the first signal changes from the second state to the first state;
after a lapse of a first predefined waiting time beginning from a first time point at which the first signal changes from the first state to the second state, reset the power management circuit while maintaining the supply of power to the at least one internal component.

10. The electronic device of claim 2, wherein the power management circuit is configured to:
when the first signal changes from the second state to the first state, terminate power supply to an entirety of the electronic device.

11. The electronic device of claim 2, wherein the power management circuit is configured to
sense a change in the second signal according to setting of a user; and
maintain a supply of power to the at least one internal component, if the first signal changes from the second state to the first state.

12. The electronic device of claim 1, further comprising a processor configured to control the power management circuit, wherein processing of the first signal by the power management circuit overrides a power control signal transmitted from the processor.

13. An electronic device, comprising:
a housing including an opening defined on at least one surface of the housing;
a socket adjacent to the opening in the housing;
a tray insertable into the socket through the opening and configured to hold one or more cards;
a battery; and
a power management circuit electrically connected with the socket and configured to control power provided from the battery,
a first terminal connected to the power management circuit, the first terminal included in the socket,
a moving unit included in the socket that is movable when force is applied via external pressure; and
a tray discharge unit configured to eject the tray from the socket to an external environment of the electronic device via a force transmitted through movement of the moving unit over a first distance,
wherein the power management circuit is configured to control a provision of power from the battery to at least one internal component of the electronic device, based on a change in a first signal detected via the first terminal and caused by movement of the moving unit.

14. The electronic device of claim 13, wherein a contact state of the first terminal of the socket changes when the moving unit moves by a second distance via application of additional pressure, after the moving unit moved by the first distance via the external pressure.

15. The electronic device of claim 14, wherein the socket includes an elastic portion connected to the moving unit, and wherein the elastic portion pushes the moving unit into the external environment out of the electronic device when the moving unit moves by the second distance.

16. The electronic device of claim 13, wherein the socket further includes a rotating unit that is rotatable according to the force transmitted through the moving unit or the tray discharge unit, and wherein a contact state of the first terminal is changed by rotation of the rotating unit.

17. The electronic device of claim 13, wherein the socket further includes a switch, in which a state of the switch is changed by the force transmitted through the moving unit or the tray discharge unit, and wherein a contact state of the first terminal is changed between activated and deactivated, according to the change in the state of the switch.

18. The electronic device of claim 13, wherein the tray includes a first card region and a second card region, and wherein at least one of the first card region and the second card region is capable of receiving a plurality of different cards.

19. The electronic device of claim 13, wherein the tray includes a second terminal contacting the first terminal.

20. The electronic device of claim 13, wherein the housing is implemented in a keyless form by omitting any mechanical buttons.

* * * * *